United States Patent
Watanabe et al.

(10) Patent No.: US 9,583,817 B2
(45) Date of Patent: Feb. 28, 2017

(54) WIRELESS MODULE

(71) Applicant: Panasonic Intellectual Property Management Co., Ltd., Osaka (JP)

(72) Inventors: Kentaro Watanabe, Hyogo (JP); Yuichi Kashino, Ishikawa (JP); Suguru Fujita, Tokyo (JP); Kohei Sugimoto, Osaka (JP); Ryosuke Shiozaki, Tokyo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 71 days.

(21) Appl. No.: 14/428,666

(22) PCT Filed: Jun. 10, 2014

(86) PCT No.: PCT/JP2014/003080
§ 371 (c)(1),
(2) Date: Mar. 17, 2015

(87) PCT Pub. No.: WO2014/208027
PCT Pub. Date: Dec. 31, 2014

(65) Prior Publication Data
US 2015/0249283 A1 Sep. 3, 2015

(30) Foreign Application Priority Data
Jun. 25, 2013 (JP) ................................. 2013-132929

(51) Int. Cl.
*H01Q 1/24* (2006.01)
*H01Q 1/27* (2006.01)
*H01Q 1/42* (2006.01)

(52) U.S. Cl.
CPC ............... *H01Q 1/243* (2013.01); *H01Q 1/24* (2013.01); *H01Q 1/273* (2013.01); *H01Q 1/42* (2013.01); *H01Q 1/421* (2013.01)

(58) Field of Classification Search
CPC .......... H01Q 1/273; H01Q 1/24; H01Q 1/243; H01Q 1/42; H01Q 1/421
See application file for complete search history.

(56) References Cited

U.S. PATENT DOCUMENTS 8,325,094 B2 * 12/2012 Ayala Vazquez .... H01Q 1/2258
343/700 MS
8,736,495 B2 * 5/2014 Cho .................... G06K 19/0723
343/702
(Continued)

FOREIGN PATENT DOCUMENTS

| JP | 2004-015408 | 1/2004 |
| JP | 2005-244742 | 9/2005 |

(Continued)

OTHER PUBLICATIONS

International Search Report of PCT application No. PCT/JP2014/003080 dated Sep. 16, 2014.

*Primary Examiner* — Hoang V Nguyen
(74) *Attorney, Agent, or Firm* — Seed IP Law Group LLP

(57) ABSTRACT

A wireless device that suppresses deterioration of antenna characteristics and can be made thin is provided. The wireless device is provided with a substrate, a wireless module that is mounted on the substrate and has an antenna unit, and a casing that accommodates the substrate and the wireless module. The wireless device has a gap of a length that is an approximate multiple of a half-wavelength of a radio wave corresponding to a communication frequency of the antenna unit, from the antenna unit toward the casing.

18 Claims, 18 Drawing Sheets

(56) References Cited

U.S. PATENT DOCUMENTS

2004/0066346 A1    4/2004   Huor
2012/0044113 A1    2/2012   Satoh et al.

FOREIGN PATENT DOCUMENTS

| JP | 2006-140956 | 6/2006 |
|---|---|---|
| JP | 2007-097084 | 4/2007 |
| JP | 2009-206604 | 9/2009 |
| JP | 2009-218993 | 9/2009 |
| JP | 2012-044402 | 3/2012 |

\* cited by examiner

FIG. 14
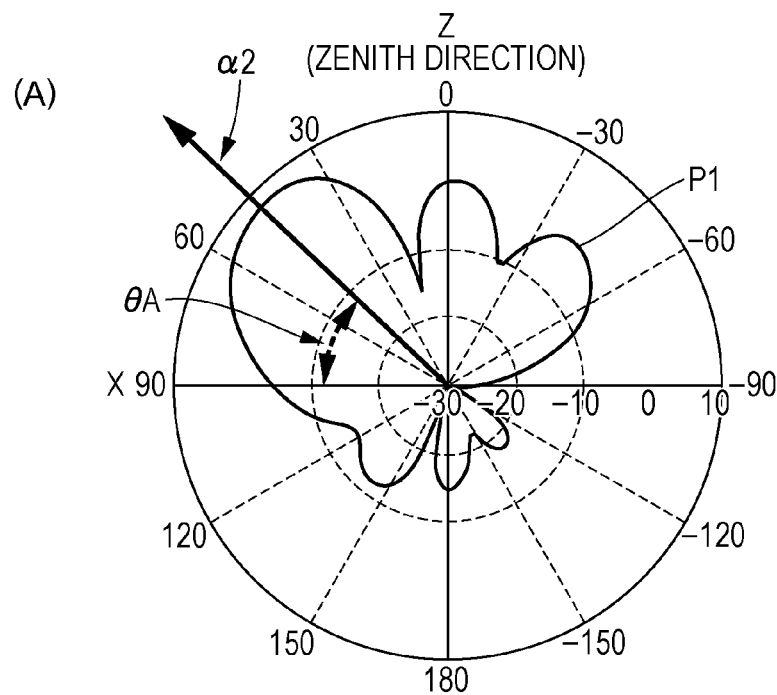
(A)
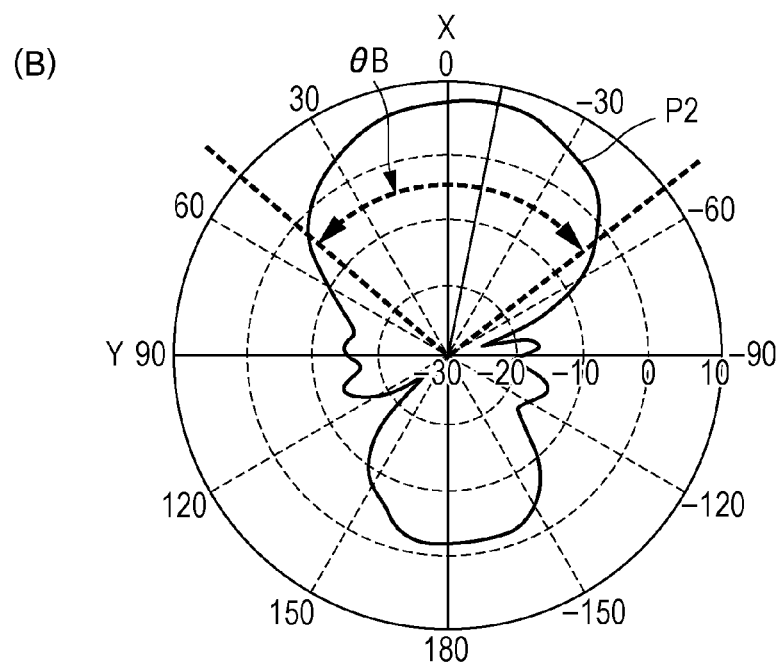
(B)

WIRELESS MODULE

TECHNICAL FIELD

The present disclosure relates to a wireless module.

BACKGROUND ART

In wireless devices in which an antenna-equipped wireless module is stored inside a casing, antenna characteristics sometimes deteriorate. In order to improve antenna characteristics, the following antennas are known. For example, a microstrip antenna that has a dielectric adhered to an antenna surface is known (for example, see PTL 1). Furthermore, an antenna device which has a radome that maintains a space in a constant manner between a radiation element and interior glass, which corresponds to a casing, is known (for example, see PTL 2).

CITATION LIST

Patent Literature

PTL 1: Japanese Unexamined Patent Application Publication No. 2005-244742

PTL 2: Japanese Unexamined Patent Application Publication No. 2007-097084

SUMMARY OF INVENTION

Technical Problem

In the technology of PTL 1 and 2, it was difficult to suppress deterioration of antenna characteristics and to make the wireless device thin.

An embodiment of the present disclosure takes the aforementioned circumstances into consideration and provides a wireless device that suppresses deterioration of antenna characteristics and can be made thin.

Solution to Problem

A wireless device in an embodiment of the present disclosure comprises a substrate, a wireless module that is mounted on the substrate and has an antenna unit, and a casing that accommodates the substrate and the wireless module. The wireless device has a gap from the antenna unit toward the casing, and the gap has a length that is an approximate multiple of a half-wavelength of a radio wave corresponding to a communication frequency of the antenna unit.

Advantageous Effects of Invention

According to an embodiment of the present disclosure, deterioration of antenna characteristics is suppressed and thinning can be implemented.

BRIEF DESCRIPTION OF DRAWINGS

FIG. 14 is schematic views depicting an example of a radio wave radiation pattern according to an antenna in the case of the second exemplary structure of the third embodiment.

Hereinafter, embodiments of the present disclosure are described using the drawings.

(Circumstances Leading to Obtaining an Embodiment According to the Present Disclosure)

In the technology of PTL 1, when there is a manufacturing error, there are cases where the dielectric does not adhere to the antenna surface, and the antenna characteristics deteriorate. Furthermore, there is a possibility of deviation occurring in the attachment position due to the manufacturing error, stress being applied to the module and the casing, and the module or the casing breaking.

In the technology of PTL 2, the thickness of an air layer between a radiation element and a ground plate is a length that is given in centimeter units, and additionally has a radome, and it is therefore difficult to make the wireless device thin.

Hereinafter, a description is given with respect to a wireless device that suppresses deterioration of antenna characteristics and can be made thin.

(First Embodiment)

Figure 1:
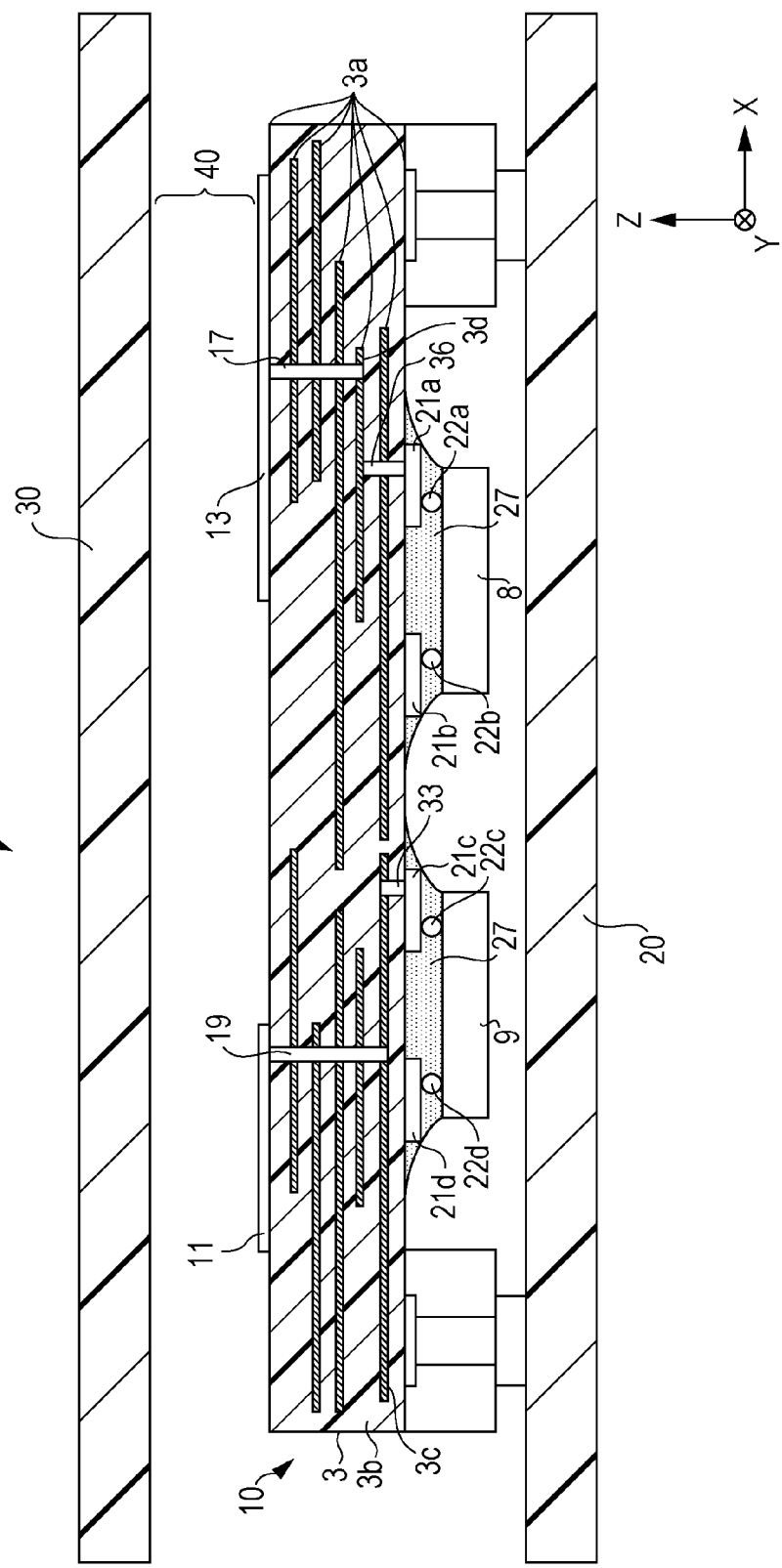
FIG. 1 is a cross-sectional view depicting a first exemplary structure of a wireless device in a first embodiment.

FIG. 1 is a cross-sectional view depicting a wireless device 1 as a first exemplary structure of a wireless device in the first embodiment. The wireless device 1 includes a wireless module 10, a substrate (set substrate 20) on which the wireless module 10 is mounted, and a casing (set casing 30) in which the wireless module 10 and the set substrate 20 are accommodated.

Here, the plane parallel to the surface of a module substrate 3 is the X-Y plane, and, in FIG. 1, the horizontal direction is the X direction and the depth direction is the Y direction. Furthermore, the direction perpendicular to the surface of the module substrate 3, namely the direction perpendicular to the X-Y plane, is the Z direction.

The wireless module 10 includes the module substrate 3, on which antennas 13 are mounted on one surface. The module substrate 3 is formed, for example, in a rectangular plate shape, and is a multilayer substrate that includes, for example, seven metal layers 3a and a dielectric layer 3b filled between the metal layers 3a. The antennas 13, which are made up of, for example, 2×2 (four) patch antennas, are formed on the uppermost layer of the module substrate 3. Furthermore, a ground (GND) pattern 11 is formed on the uppermost layer of the module substrate 3.

LSIs 8 and 9 are mounted on the lowermost layer of the module substrate 3 with pads 21a to 21d and solder balls 22a to 22d between the LSIs 8 and 9 and the module substrate 3. A mold section 27 in which, for example, resin has been filled is formed between the LSIs 8 and 9 and the lower surface of the module substrate 3 in such a way as to cover the pads 21a to 21d and the solder balls 22a to 22d.

The position of the LSI 8 in the X direction is, for example, substantially the same as the position of the antennas 13. The LSI 8 includes, for example, a high-frequency (RF: radio frequency) IC (integrated circuit) that processes microwave signals transmitted between the LSI 8 and the antennas 13. The antennas 13 are connected to the LSI 8 by way of a signal via 17 that is connected to a wiring layer 3d, the wiring layer 3d, a signal via 36 that is connected to the wiring layer 3d and the pad 21a, the pad 21a, and the solder ball 22a.

The position of the LSI 9 in the X direction is, for example, substantially the same as the position of the GND pattern 11. The LSI 9 includes, for example, a baseband IC that processes a baseband signal. The GND pattern 11 is connected to a GND of the LSI 9 by way of a GND via 19 that is connected to a GND layer 3c, the GND layer 3c, a GND via 33 that is connected to the GND layer 3c and the pad 21c, the pad 21c, and the solder ball 22c.

It should be noted that, in the following exemplary structures and other embodiments, the configuration of the wireless module 10 may be the same or may be different.

The set substrate 20 is, for example, a multilayer substrate. There is at least a GND (ground conductor) on the mounting surface of the set substrate 20, and a GND of the set substrate 20 and the GND layer 3c of the wireless module 10 have substantially the same potential.

The set casing 30 accommodates the wireless module 10 and the set substrate 20, and is formed from, for example, an ABS resin.

The set casing 30 is arranged above (Z-axis positive direction) the antennas 13 of the wireless module 10, and a gap 40 is provided between the set casing 30 and the antennas 13. When the wavelength of a radio wave radiated from the antennas 13 is taken as $\lambda$, the gap 40 has a length that is an approximate multiple of 1/2 of the wavelength $\lambda$, for example. The wavelength $\lambda$ corresponds to the communication frequency of the antennas 13.

As a specific example, an approximate multiple of $\lambda/2$ is, when the Z-direction length of the gap 40 is the smallest, $\lambda \times (3/8) \leq$ the Z-direction length of the gap $40 \leq \lambda \times (5/8)$, for example. Furthermore, a space in which the Z-direction length of the gap 40 is small subsequent to the case of approximately (1/2) of the wavelength $\lambda$ is the case of approximately $\lambda(=(\lambda/2) \times 2)$, and is $\lambda \times (7/8) \leq$ the Z-direction length of the gap $40 \leq \lambda \times (9/8)$, for example.

Figure 2:
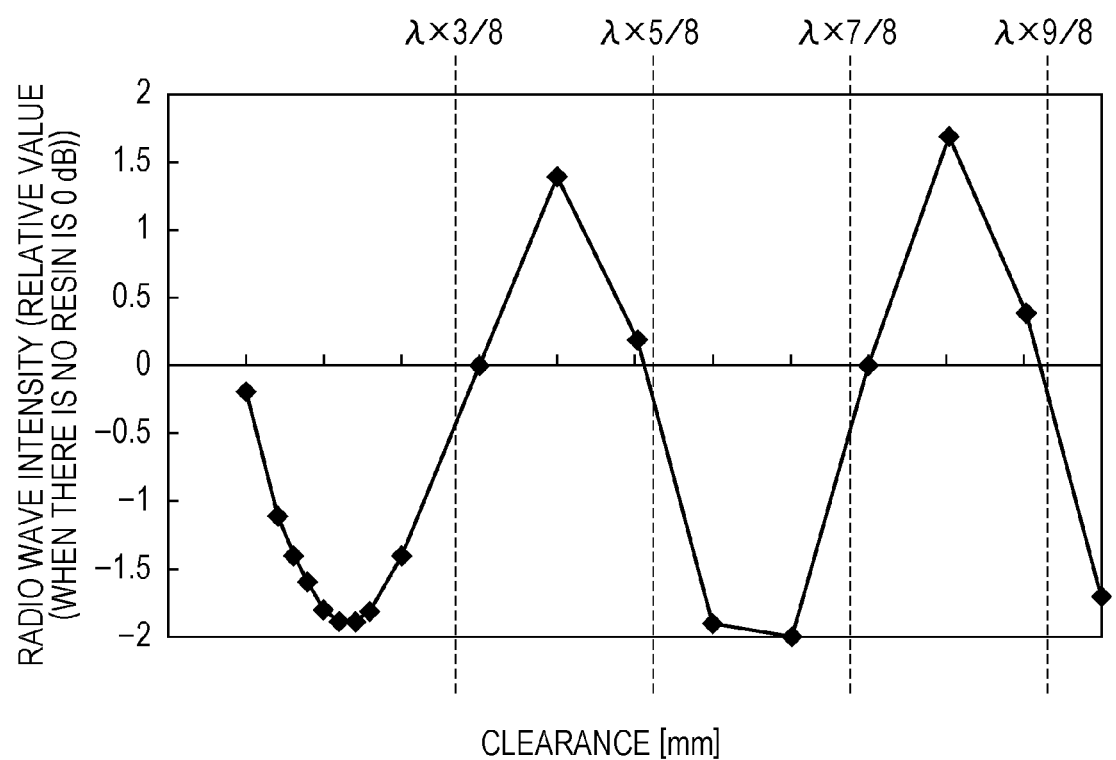
FIG. 2 is a schematic view depicting an example of the relationship between clearance and radio wave intensity in the first embodiment.

FIG. 2 is a schematic view depicting an example of the relationship between the Z-direction length (clearance) of the gap 40 and the intensity (relative value) of radio waves radiated by the antennas 13. In FIG. 2, the radio wave intensity under the condition of a resin member (for example, the set casing 30) not being present opposite the wireless module 10 is taken as a reference (0 dB), and the radio wave intensity with respect to each clearance is indicated by a relative value. This radio wave intensity indicates the radio wave intensity in positions (Z-axis positive side with respect to the antennas 13) opposing the antennas 13.

When reference is made to FIG. 2, it can be understood that the radio wave intensity increases when the clearance is approximately $\lambda/2$ or approximately $\lambda$, and that a satisfactory radio wave intensity is obtained when there is a clearance of a prescribed range that includes approximately $\lambda/2$ or approximately $\lambda$.

In this way, the wireless device 1 has a gap 40 of a length that is approximately $\lambda \times (1/2) \times n$ (natural number), between the antennas 13 and the set casing 30 here, from the antennas 13 to the set casing 30 side. In other words, the Z-direction length of the gap 40 is a length that is an approximate multiple of a half-wavelength of a radio wave. Thus, it is possible to reduce the effect on antenna characteristics by the reflection of radio waves in the set casing 30, and it is possible to suppress changes in the radiation pattern (for example, gain and directivity) of the antennas 13. Furthermore, the gap 40 can be ensured without providing a separate member (for example, a radome), and therefore thinning can be implemented.

Figure 3:
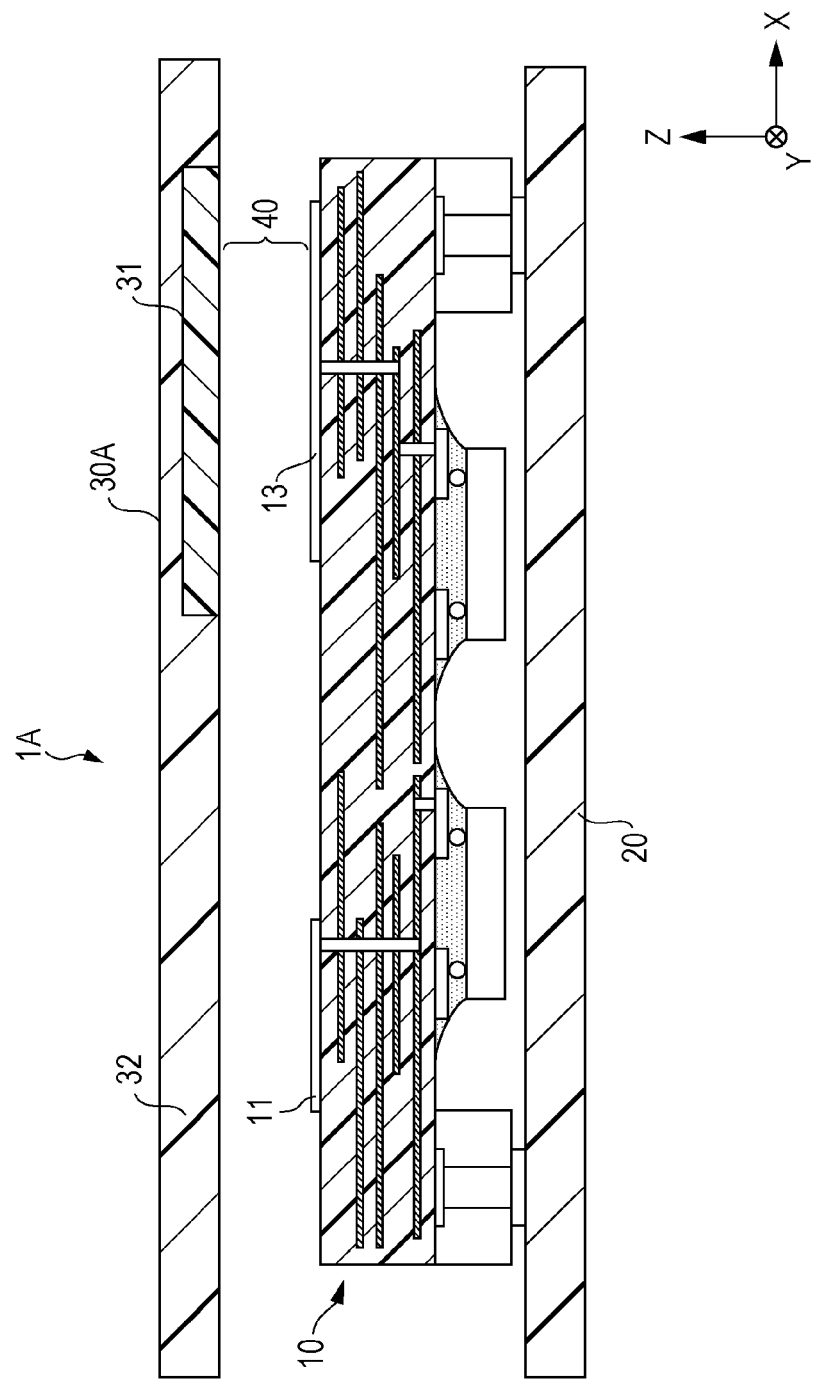
FIG. 3 is a cross-sectional view depicting a second exemplary structure of the wireless device in the first embodiment.

FIG. 3 is a cross-sectional view depicting a wireless device 1A as the second exemplary structure of the wireless device in the first embodiment. In FIG. 1, the set casing 30 was formed from a uniform material; however, in FIG. 3, an antenna-opposing region 31 in a set casing 30A that opposes the antennas 13 may be formed from a different material from another region 32 in the set casing 30A. As the different material, for example, a material having a lower relative permittivity, or a material having a smaller tan $\delta$, than the other region 32 is used. The other region 32 is an example of a non-antenna-opposing region. Thus, it is possible to reduce the loss of radio waves when a set casing is added.

For example, dielectric loss per unit length in a material having a low relative permittivity or a material having a small tan$\delta$ is $90.9 \times \sqrt{(\in r)} \times \tan\delta \times f$ (GHz) [dB/m]. Here, $\in r$ is the relative permittivity, and f is the communication frequency used by the antennas 13.

The other region 32 in the set casing 30A is, for example, formed from an ABS resin. The antenna-opposing region 31 in the set casing 30A is, for example, formed from a polymethacrylimide hard foam body (for example, ROHACELL (registered trademark)) or polytetrafluoroethylene (for example, Teflon (registered trademark)).

Furthermore, the size of the antenna-opposing region 31 in the X-Y plane is the same of the size of a recess 37 described hereinafter.

In this way, the wireless device 1A has a gap of a length of approximately λ×(1/2)×n, between the antennas 13 and the set casing 30A, and the antenna-opposing region 31 is formed from, for example, a material having a lower relative permittivity, or a material having a smaller tanδ, than the other region 32. Thus, the effect on antenna characteristics caused by the passage of radio waves in the set casing 30A can be further reduced.

Figure 4:
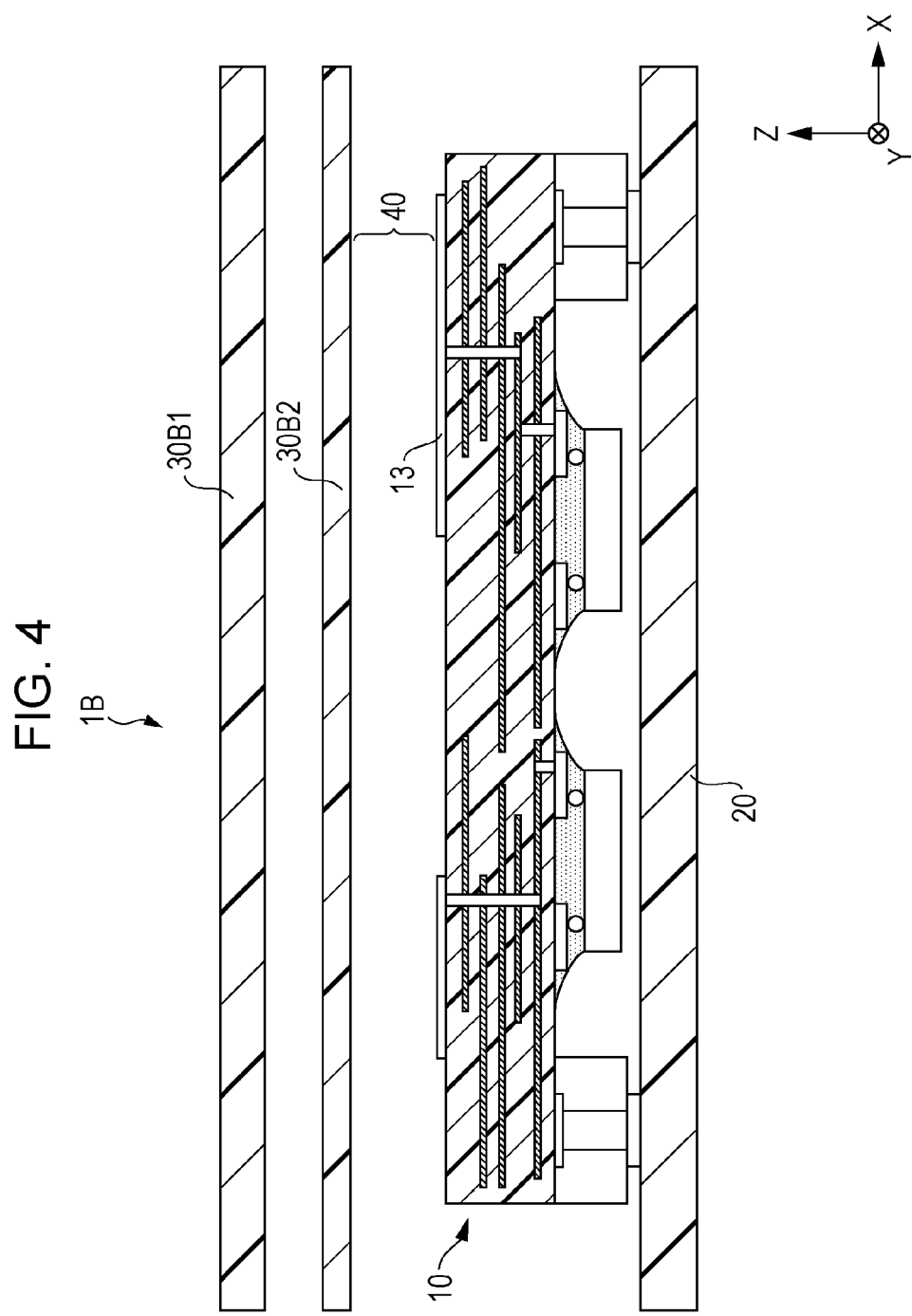
FIG. 4 is a cross-sectional view depicting a third exemplary structure of the wireless device in the first embodiment.

FIG. 4 is a cross-sectional view depicting a wireless device 1B as a third exemplary structure of the wireless device in the first embodiment. The wireless device 1B has a plurality of set casings. A first set casing 30B1 corresponds to the aforementioned set casing 30 and is, for example, a main body cover for the wireless device 1B. A second set casing 30B2 (an example of a first member) is, for example, a battery cover and is formed from, for example, a resin. In the case where the distance between the antennas 13 and the second set casing 30B2 is an approximate multiple of 1/2 of the wavelength λ, the wireless device 1B may have two or more casings.

According to the wireless device 1B, deterioration of antenna characteristics can be suppressed even when there is a plurality of set casings.

Figure 5:
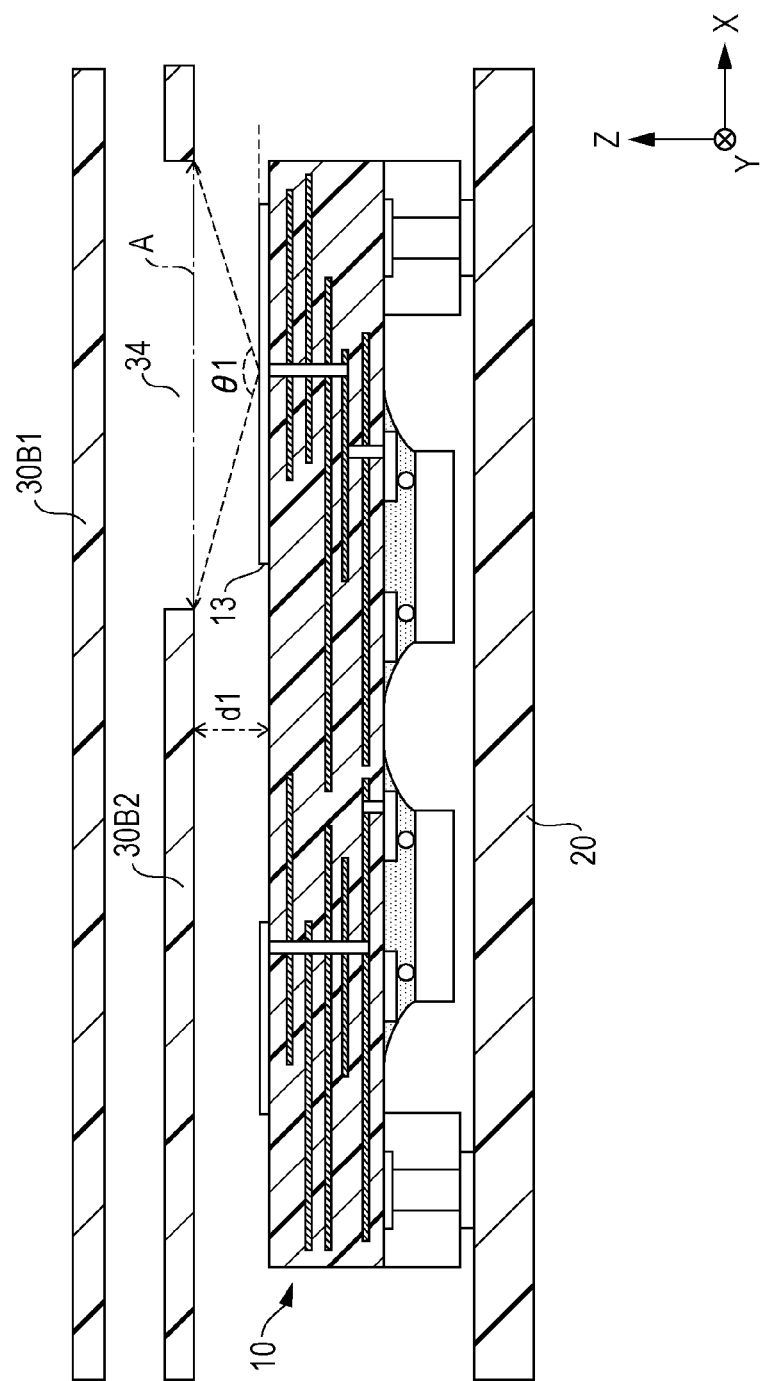
FIG. 5 is a cross-sectional view depicting a fourth exemplary structure of the wireless device in the first embodiment.

FIG. 5 is a cross-sectional view depicting a wireless device 1C as a fourth exemplary structure of the wireless device in the first embodiment. The wireless device 1C is a modified example of the wireless device 1B. In the wireless device 1C, for the case where the distance between the antennas 13 and the second set casing 30B2 is not an approximate multiple of 1/2 of the wavelength λ, an opening 34 is provided in a region in the second set casing 30B2 that opposes the antennas 13. The distance between the antennas 13 and the first set casing 30B1 is, for example, an approximate multiple of 1/2 of the wavelength λ.

Figure 6:
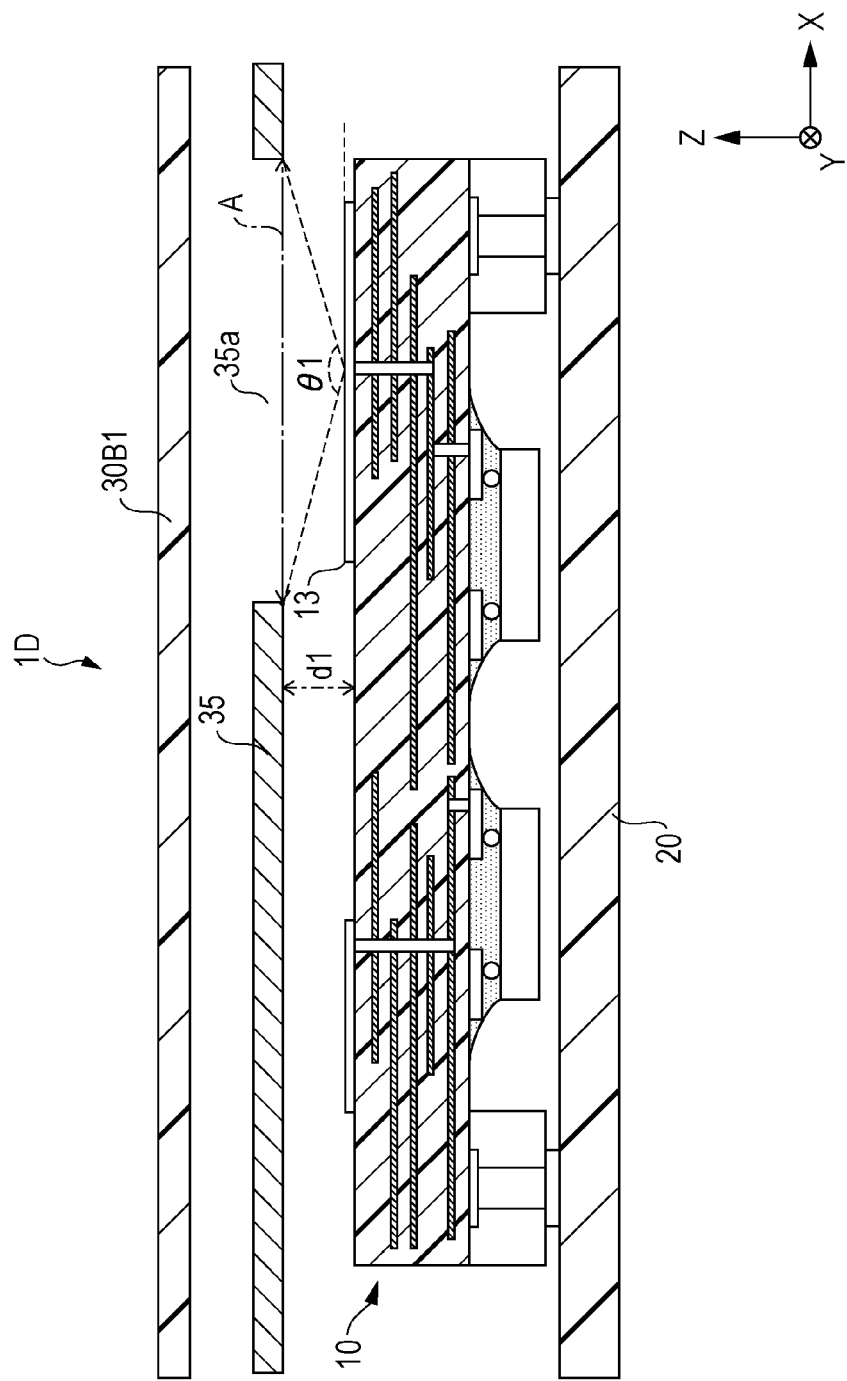
FIG. 6 is a cross-sectional view depicting a fifth exemplary structure of the wireless device in the first embodiment.

FIG. 6 is a cross-sectional view depicting a wireless device 1D as a fifth exemplary structure of the wireless device in the first embodiment. The wireless device 1D is provided with an electromagnetic shield 35 (an example of the first member) that has an opening 35a in a region opposing the antennas 13, between the wireless module 10 and the set casing 30B1. For example, the distance between the antennas 13 and the electromagnetic shield 35 is not an approximate multiple of 1/2 of the wavelength λ, and the distance between the antennas 13 and the set casing 30B1 is an approximate multiple of 1/2 of the wavelength λ.

Figure 7:
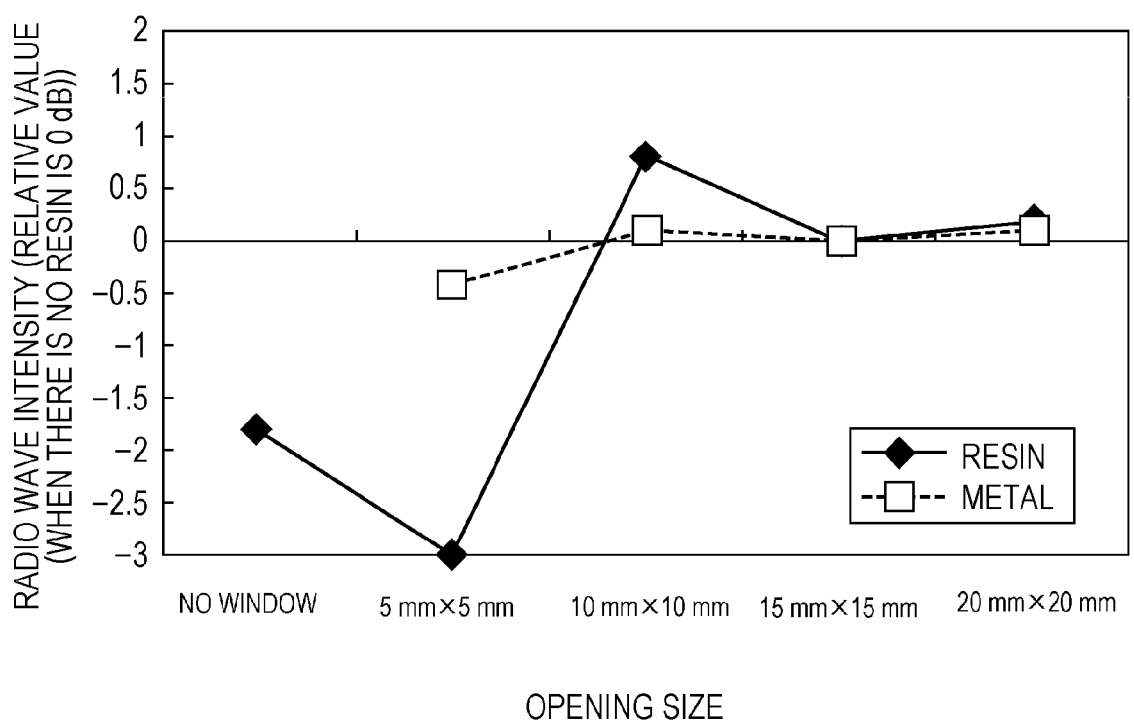
FIG. 7 is a schematic view depicting an example of the relationship between the size of an opening in the wireless device and radio wave intensity in the case of the fourth exemplary structure or the fifth exemplary structure in the first embodiment.

FIG. 7 is a schematic view depicting an example of the relationship between the size (opening size) of the openings 34 and 35a in the X-Y plane in the case of the wireless device 1C or the wireless device 1D and the radio wave intensity (relative value) of radio waves radiated by the antennas 13. In FIG. 7, the radio wave intensity under the condition of a resin member (for example, the second set casing 30B2) not being present opposite the wireless module 10 is taken as a reference (0 dB), and the radio wave intensity with respect to each opening size is indicated by a relative value. This radio wave intensity indicates the radio wave intensity in positions (Z-axis positive side with respect to the antennas 13) opposing the antennas 13.

Furthermore, FIG. 7 depicts the case where a distance d1 (see FIG. 5 and FIG. 6) between the wireless module 10 and the second set casing 30B2 or the electromagnetic shield 35 is 1 mm. In this case, the length A (see FIG. 5 and FIG. 6) of one side of the openings 34 and 35a is as follows, for example.

$$A = 10 \times \sin(\theta1/2)/\sin(90-\theta1/2) \times d1$$

It should be noted that "θ1" indicates the angle range in which the gain of the antennas 13 obtained when not placed in the set casing 30B1 becomes approximately 1/4.

Figure 8:
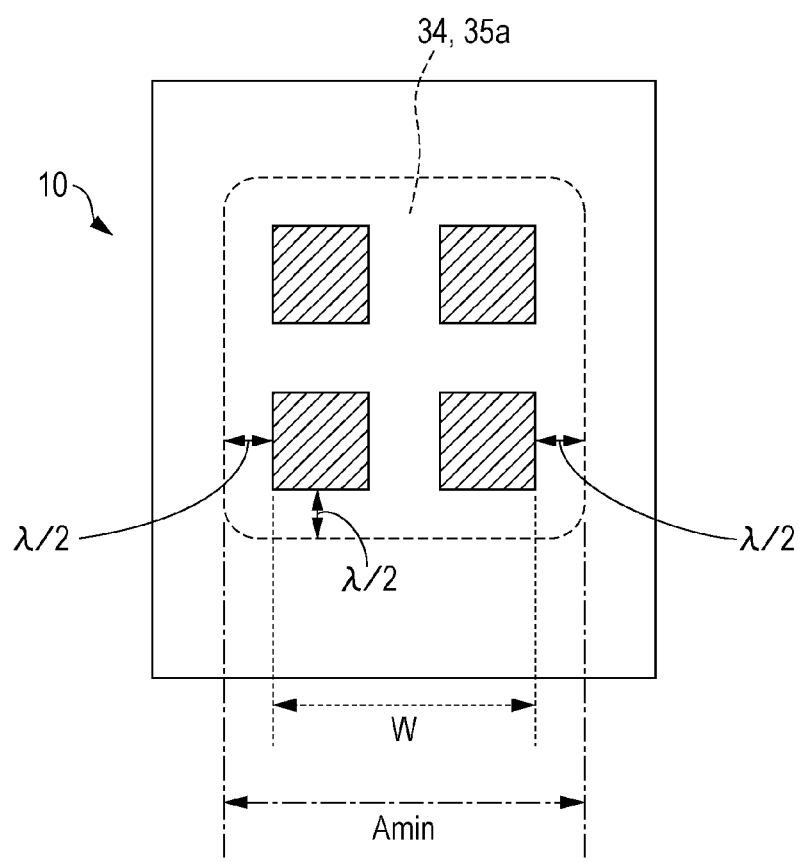
FIG. 8 is a schematic view depicting the smallest opening size in the case where the shape of the opening in the wireless device in the fourth exemplary structure or the fifth exemplary structure in the first embodiment is square.

FIG. 8 is a schematic view depicting the smallest opening size Amin in the case where the shape of the openings 34 and 35a is square. In the case where the shape of the openings 34 and 35a is square, the condition of A≥λ+antenna size W is satisfied.

Figure 9:
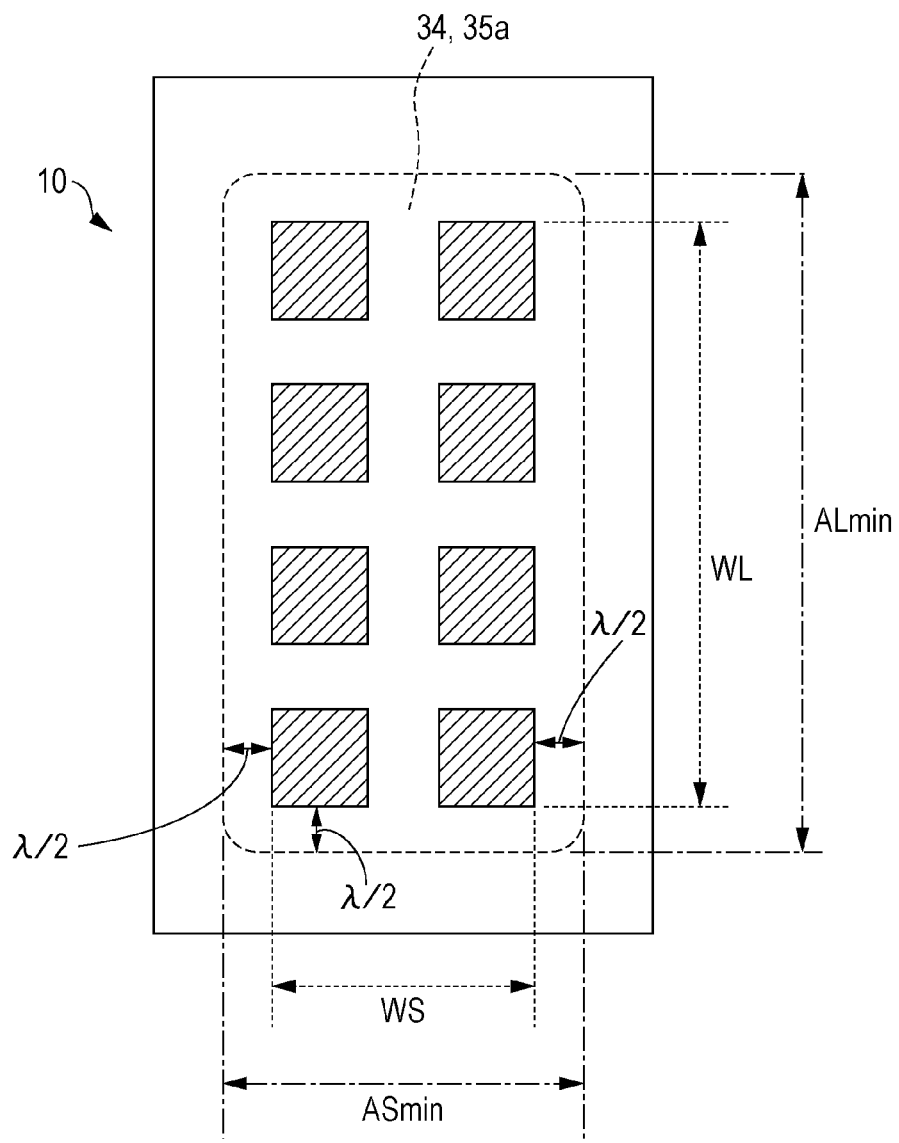
FIG. 9 is a schematic view depicting the smallest opening size in the case where the shape of the opening in the wireless device in the fourth exemplary structure or the fifth exemplary structure in the first embodiment is rectangular.

FIG. 9 is a schematic view depicting the smallest opening sizes ASmin and ALmin in the case where the shape of the openings 34 and 35a is rectangular. In the case where the shape of the openings 34 and 35a is rectangular, the condition of the short side length AS≥λ+antenna size WS is satisfied, and the condition of the long side length AL≥λ+ antenna size WL is satisfied.

When reference is made to FIG. 7, it can be understood that the radio wave intensity becomes the greatest when the openings 34 and 35a are 10 mm (X-direction length)×10 mm (Y-direction length). Consequently, the openings 34 and 35a are formed in a square shape of the order of 10 mm (X-direction length)×10 mm (Y-direction length), for example.

In this way, the wireless devices 1C and 1D are provided with the openings 34 and 35a in an antenna-opposing region in the second set casing 30B2 or the electromagnetic shield 35 that is expected to have an effect on antenna characteristics. Thus, it is possible to reduce the effect on antenna characteristics caused by the reflection of radio waves in the antenna-opposing region, and it is possible to suppress changes in the radiation pattern of the antennas 13. Furthermore, in the wireless device 1C and the wireless device 1D, the behavior (for example, reflection and diffraction) of radio waves differs according to whether the material is a dielectric or a conductor, and the difference in characteristics depicted in FIG. 7, for example, occurs.

(Second Embodiment)

In the first embodiment, a description was given regarding the case where a set casing that is arranged above (Z-axis positive side) the wireless module 10 is a substantially flat plate. In the second embodiment, it is assumed that a recess is provided in a set casing. By providing a recess, the set casing can be arranged closer to the wireless module 10 than in the first embodiment, and the wireless device can be made thin.

Figure 10:
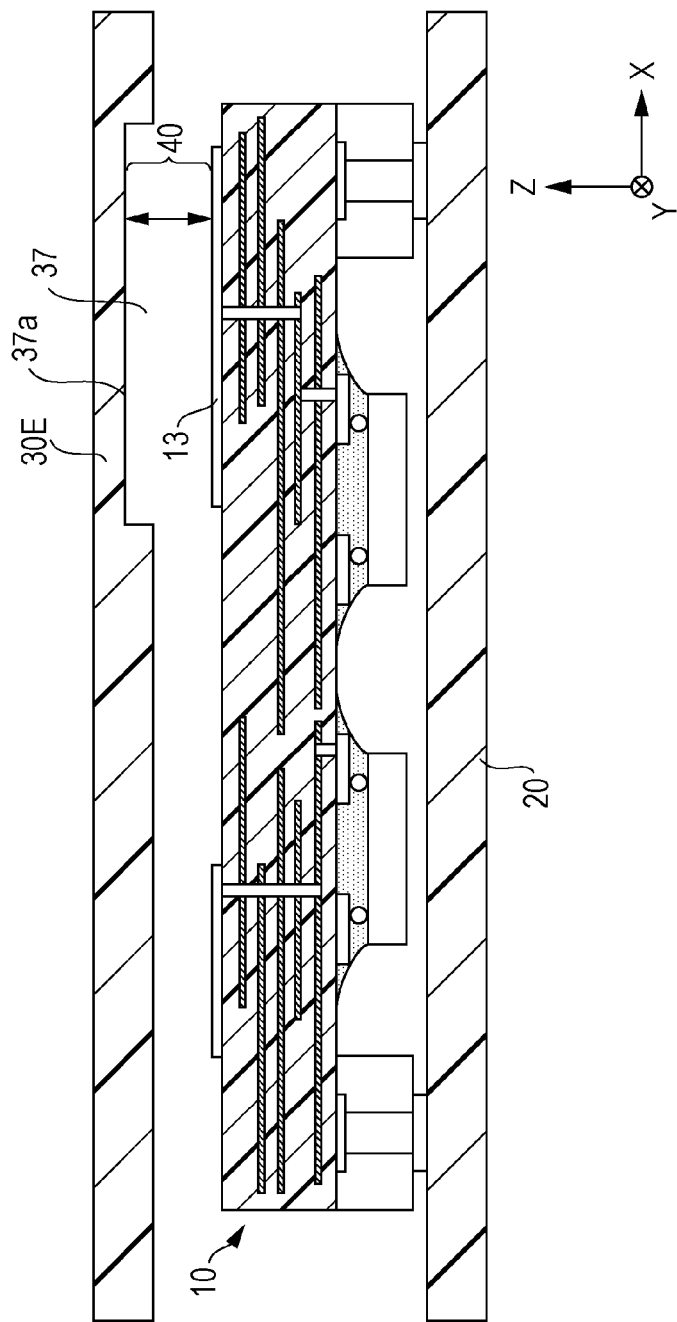
FIG. 10 is a cross-sectional view depicting a first exemplary structure of a wireless device in a second embodiment.

FIG. 10 is a cross-sectional view depicting a wireless device 1E as a first exemplary structure of a wireless device in the second embodiment.

In the wireless device 1E, the distance between the antennas 13 and a set casing 30E may be an approximate multiple of λ/2, for example.

In the wireless device 1E, when a distance of approximately λ/2 cannot be ensured as the distance between the antennas 13 and the set casing 30E, the recess 37 is provided in a region in the set casing 30E that opposes the antennas 13. A distance that is an approximate multiple of λ/2 is ensured as the distance between the antennas 13 and the bottom surface 37a of the recess 37. More specifically, the Z-direction length of the gap 40 in FIG. 10 corresponds to the distance between the antennas 13 and the bottom surface 37a of the recess 37, and is an approximate multiple of λ/2. It should be noted that the recess 37 is an example of a recessed section.

According to the wireless device 1E, the recess 37 is provided in the set casing 30E, and the set casing 30E can be arranged as close as possible to the wireless module 10. Consequently, the wireless device 1E can be made thinner. Furthermore, by setting the Z-direction length of the gap 40 to be an approximate multiple of λ/2, deterioration of antenna characteristics can be suppressed as in the first embodiment.

Figure 11:
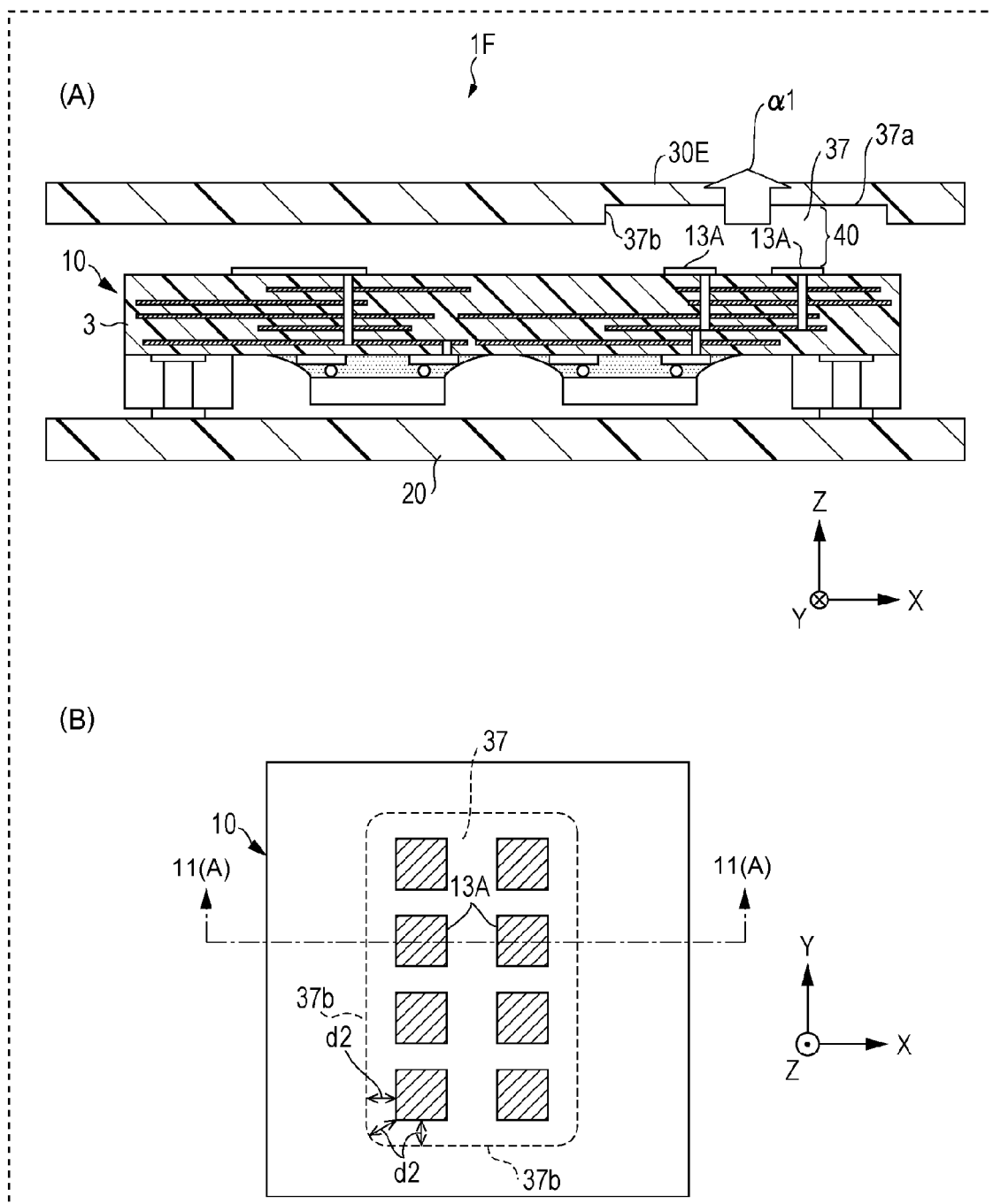
FIG. 11 is a cross-sectional view and a plan view depicting a second exemplary structure of the wireless device in the second embodiment.

FIG. 11(A) is a cross-sectional view depicting a wireless device 1F as a second exemplary structure of the wireless device in the second embodiment, and is an 11(A)-11(A) cross-sectional view of FIG. 11(B). FIG. 11(B) is a plan view depicting an exemplary structure of the wireless device 1F, and depicts the case where the wireless module 10 is viewed from above (Z-axis positive side). Furthermore, in FIG. 11(B), the portion surrounding antennas 13A in the wireless module 10 is depicted, and the depiction of other portions is omitted.

In FIGS. 11(A) and (B), it is assumed that the antennas 13A are 2×4 patch antennas, and radiation directivity according to the antennas 13A is a direction (Z direction) that is orthogonal to the module substrate 3 (see arrow α1). The recess 37 is formed in such a way as to surround the antennas 13A, and the distance d2 between the antennas 13A and an end section (side surface 37b) of the recess 37 is an approximate multiple of 1/2 of the wavelength λ of a radio wave radiated by the antennas 13A.

It should be noted that, although the corner sections of the recess 37 are formed in a rounded manner in FIG. 11(B), the shape of the corner sections of the recess 37 depends on the processing of the set casing 30E. For example, the corner sections of the recess 37 would be right-angled when the set casing 30E were processed by way of a right-angle processing method.

According to the wireless device 1F, as a result of the distance between the antennas 13A and the side surface 37b of the recess 37 being set to an approximate multiple of λ/2, it is possible to suppress the effect of reflected waves on components that have a direction that follows the X-Y plane from among radio waves radiated from the antennas 13A.

(Third Embodiment)

In the third embodiment, a case is presented where the directivity of radio waves radiated from an antenna is an inclined direction (a direction offset by a prescribed angle from perpendicular) rather than being perpendicular (Z-axis direction) to the module substrate 3.

Figure 12:
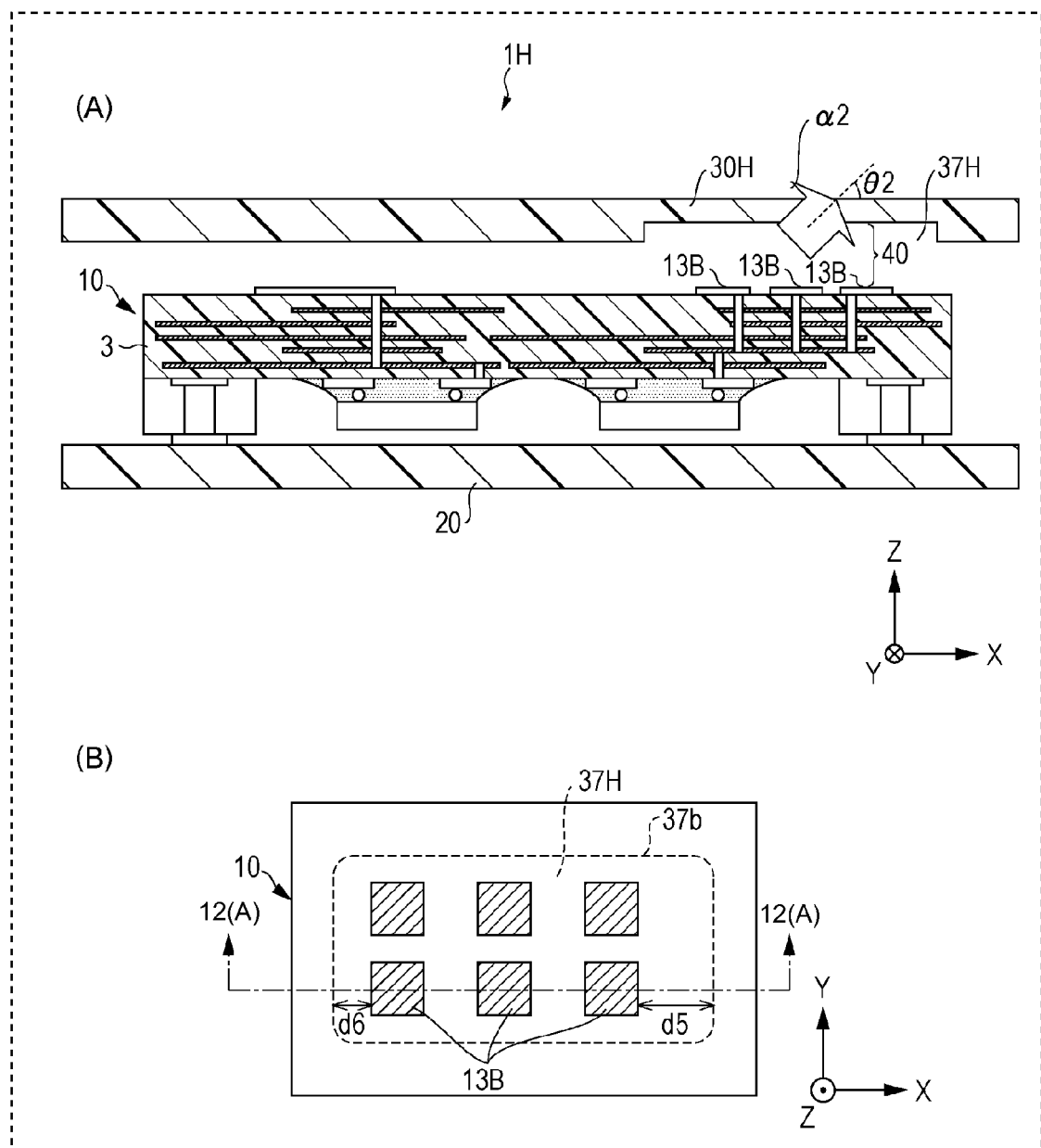
FIG. 12 is a cross-sectional view and a plan view depicting a first exemplary structure of a wireless device in a third embodiment.

FIG. 12(A) is a cross-sectional view depicting a wireless device 1H as a first exemplary structure of a wireless device in the third embodiment, and is a 12(A)-12(A) cross-sectional view of the wireless device 1H of FIG. 12(B). FIG. 12(B) is a plan view depicting an exemplary structure of the wireless device 1H, and depicts the case where the wireless module 10 is viewed from above (Z-axis positive side). Furthermore, in FIG. 12(B), the portion surrounding antennas 13B in the wireless module 10 is depicted, and the depiction of other portions is omitted.

In the second embodiment, it was assumed that the radiation direction of radio waves is orthogonal to the module substrate 3, and therefore a description was given of the case where the bottom surface 37a or the side surface 37b in a recess 37 is line-symmetrical with respect to the antennas 13A in the X-Y plane.

In the present embodiment, it is assumed that radio waves are radiated in an inclined direction from the module substrate 3, namely in a direction that is inclined with respect to the Z direction. For example, in FIGS. 12(A) and (B), it is assumed that the antennas 13B are 3×2 patch antennas, and the radiation direction of radio waves according to the antennas 13B is inclined at a prescribed angle from the Z direction to the X-axis positive direction (see arrow α2).

In the case where the radiation direction of radio waves according to the antennas 13B is inclined at a prescribed angle from the Z direction, part of the bottom surface 37a or the side surface 37b of the recess 37H of a set casing 30H that is positioned in the radiation direction has an effect on antenna characteristics. In the wireless device 1H, the distance between the part of the recess 37H that is positioned in the radiation direction of radio waves according to the antennas 13B and the antennas 13B is longer than the distance between part of the recess 37H that is positioned in a direction other than the radiation direction of radio waves according to the antennas 13B and the antennas 13B.

For example, in the case where the radiation direction of radio waves according to the antennas 13B is inclined at 45 degrees with respect to the X-Y plane, the distance d5 between the antennas 13B at the radio-wave radiation side (the right side in FIGS. 12(A) and (B)) and the side surface 37b of the recess 37H is, for example, approximately $(\lambda/2)\times\sqrt{2}$. On the other hand, the distance d6 between the antennas 13B at the opposite side (the left side in FIGS. 12(A) and (B)) to the radio-wave radiation side and the side surface 37b of the recess 37H is, for example, approximately $\lambda/(2\sqrt{2})$. It should be noted that "$\sqrt{X}$" represents the square root of X.

Furthermore, when it is generalized that the radiation direction of radio waves according to the antennas 13B is inclined at θ2 degrees with respect to the X-Y plane, the distance d5 at the radio-wave radiation side and the distance d6 at the opposite side to the radio-wave radiation side are given as follows. It should be noted that "θ2" indicates the radiation angle (directivity angle (angle of elevation)) of radio waves according to the antennas 13B, and indicates the radiation angle of radio waves with respect to the X-Y plane.

$d5 = \lambda/2 \times (1/\sin\theta2)$ $d6 = \lambda/2 \times \sin\theta2$

According to the wireless device 1H, the distance between the antennas 13B and the side surface 37b of the recess 37H is adjusted according to the radiation direction of the radio waves of the antennas 13B. Consequently, the effect caused by reflected waves of a signal in the side surface 37b of the recess 37H can be reduced, and deterioration of antenna characteristics can be suppressed.

Figure 13:
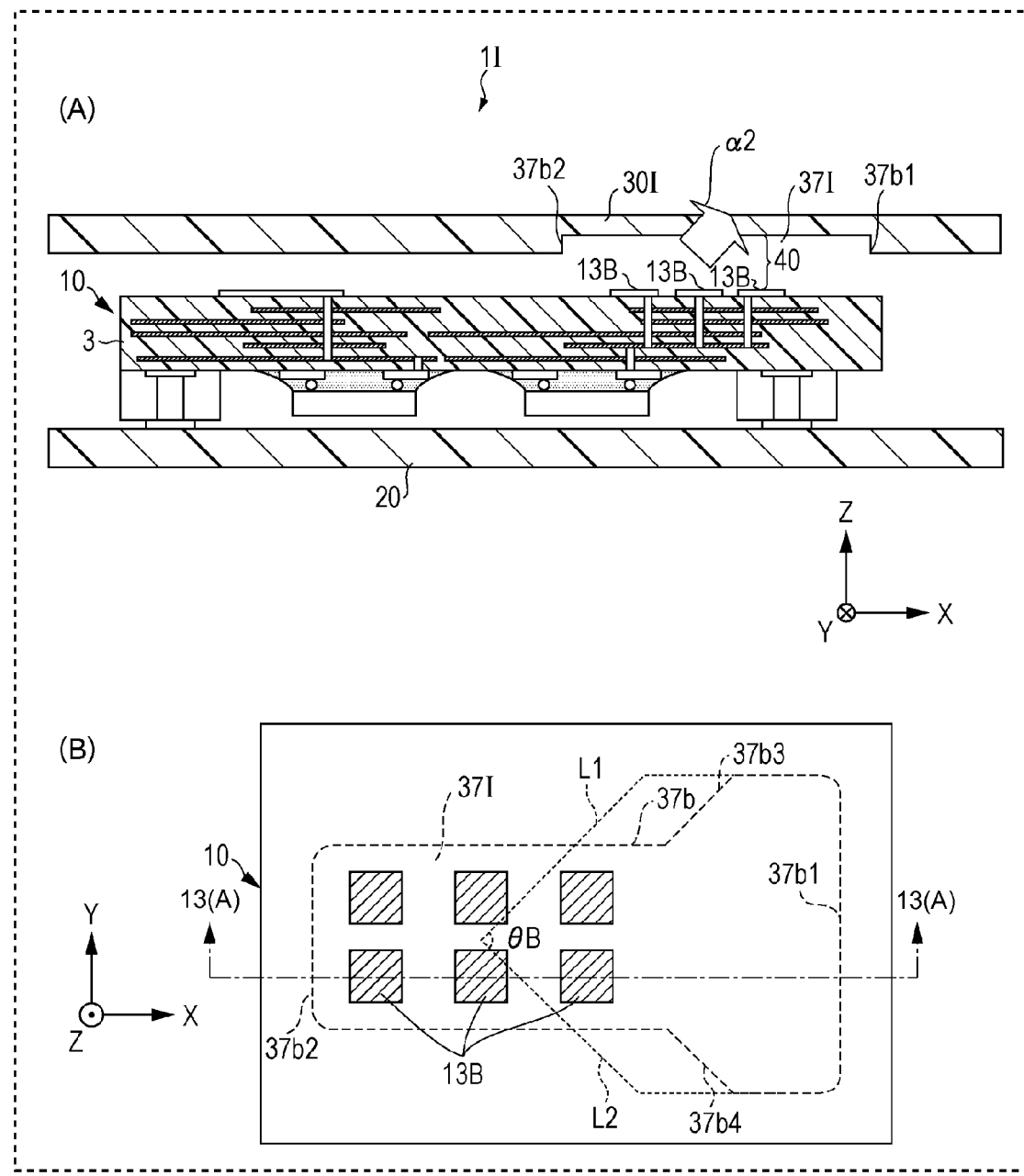
FIG. 13 is a cross-sectional view and a plan view depicting a second exemplary structure of the wireless device in the third embodiment.

FIG. 13(A) is a cross-sectional view depicting a wireless device 1I as a second exemplary structure of the wireless device in the third embodiment, and is a 13(A)-13(A) cross-sectional view of the wireless device 1I of FIG. 13(B). FIG. 13(B) is a plan view depicting an exemplary structure of the wireless device 1I, and depicts the case where the wireless module 10 is viewed from above (Z-axis positive side). Furthermore, in FIG. 13(B), the portion surrounding the antennas 13B in the wireless module 10 is depicted, and the depiction of other portions is omitted. Here, a description is given mainly with regard to portions that are different from the wireless device 1H.

In the wireless device 1H, the case where the rectangular recess 37H is provided was described as an example. In the wireless device 1I depicted in FIGS. 13(A) and (B), a set casing 30I has a recess 37I that widens in the radiation direction of the radio waves radiated by the antennas 13B. In other words, as depicted in FIG. 13(B), the recess 37I widens in the X direction and the Y direction, toward the side surface 37b at the right side (X-axis positive-side end section) of the recess 37I. The wireless device 1H is configured in such a way that, in order to reduce the effect caused by the radiation of radio waves by the antennas 13B in the horizontal direction (XY direction), the recess 37I widens as the distance from the antennas 13B in the XY direction increases.

FIGS. 14(A) and (B) are schematic views depicting an example of a radiation pattern of radio waves according to the antennas 13B in the second exemplary structure of the present embodiment. FIG. 14(A) depicts an XZ-direction radiation pattern. In FIG. 14(A), the reference sign α2 indicates the radiation direction of radio waves according to the antennas 13B, and the angle θA in FIG. 14(A) indicates the radiation angle (directivity angle (angle of elevation)) of radio waves according to the antennas 13B.

Figure 15:
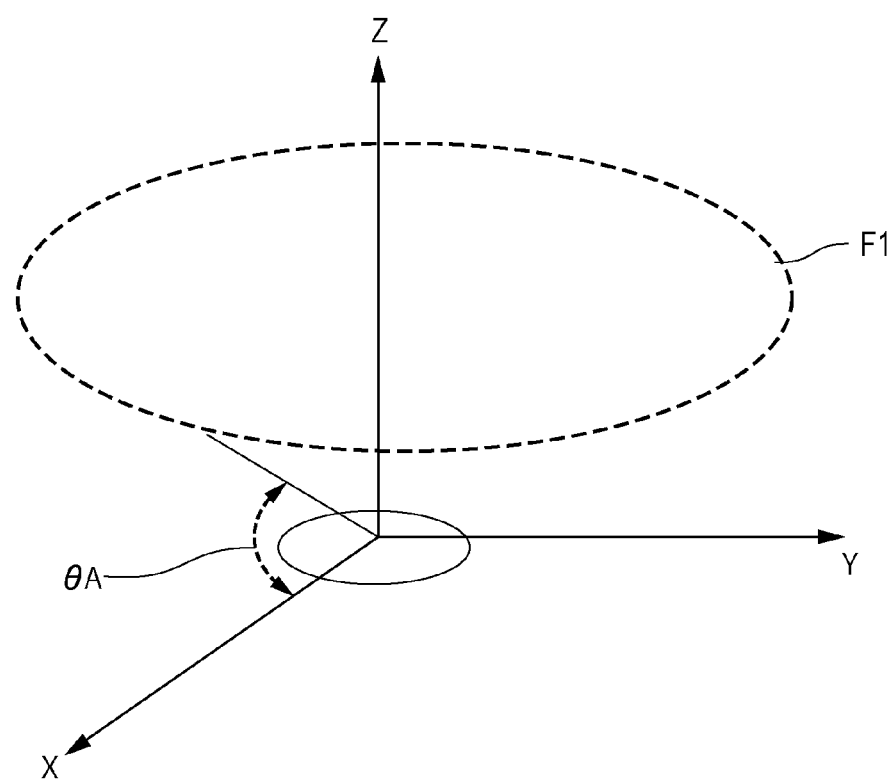
FIG. 15 is a schematic view for illustrating conical plane directivity in the third embodiment.

FIG. 14(B) depicts a radiation pattern that indicates conical plane directivity. As depicted in FIG. 15, this conical plane directivity indicates directivity in a plane F1 that is parallel to the substrate horizontal direction (XY direction) at the radiation angle θA of radio waves according to the antennas 13B.

The angle θB in FIG. 14(B) indicates an angle at which line segments L1 and L2 (see FIG. 13(B)) that define a range in which antenna gain according to the antennas 13B becomes approximately 1/4 in the XY direction are formed, with the central section of all of the antennas 13B being the starting point. The angle formed between a side surface 37b3 and a side surface 37b4, which are depicted in FIG. 13(B) and are formed in such a way that the recess 37I widens, is formed so as to be substantially coincident with the angle θB.

In FIGS. 14(A) and (B), radiation patterns P1 and P2 indicate radiation patterns of radio waves according to the antennas 13B.

Consequently, the area of a side surface 37b1 of the recess 37I that is present in the radiation direction of radio waves is formed larger than the area of a side surface 37b2 of the recess 37I that is present at the opposite side to the radiation direction of radio waves. It should be noted that the side surface 37b of the recess 37I may be a flat surface or a curved surface.

According to the wireless device 1I, the recess 37I is formed to widen in the radiation direction of radio waves according to the antennas 13B, and therefore the effect of reflected waves in the recess 37I can be suppressed. Consequently, deterioration of antenna characteristics can be suppressed.

(Fourth Embodiment)

In the second and third embodiments, descriptions have been given regarding the case where the bottom surface of a recess in a set casing is formed parallel with the front surface (outer peripheral surface) of the set casing. In the fourth embodiment, a description is given regarding the case where the bottom surface of a recess in a set casing is inclined.

Figure 16:
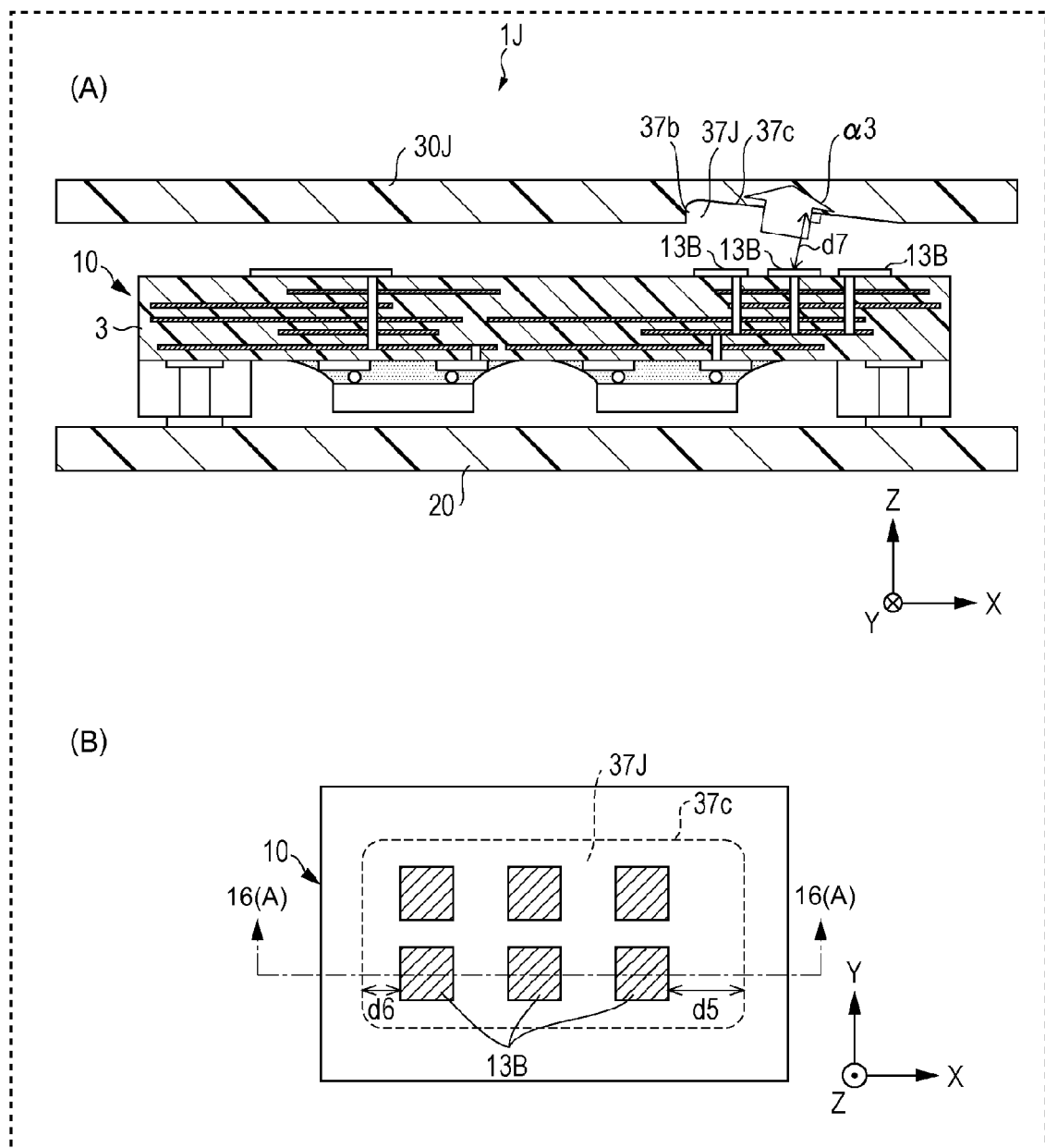
FIG. 16 is a cross-sectional view and a plan view depicting a first exemplary structure of a wireless device in a fourth embodiment.

FIG. 16(A) is a cross-sectional view depicting a wireless device 1J as a first exemplary structure of a wireless device in the fourth embodiment, and is a 16(A)-16(A) cross-sectional view of the wireless device 1J of FIG. 16(B). FIG. 16(B) is a plan view depicting an exemplary structure of the wireless device 1J, and depicts the case where the wireless module 10 is viewed from above (Z-axis positive side). Furthermore, in FIG. 16(B), the portion surrounding the antennas 13B in the wireless module 10 is depicted, and the depiction of other portions is omitted.

In the case where the radiation of radio waves from the antennas 13B is inclined (not perpendicular) with respect to the module substrate 3, when the bottom surface of the recess in the set casing is formed parallel to the module substrate 3, radio waves are incident at an incline with respect to the bottom surface of the recess. In this case, the directivity of the antennas is disturbed due to refraction in the bottom surface of the recess.

As depicted in FIG. 16(A), in the wireless device 1J, a bottom surface 37c of a recess 37J of a set casing 30J is inclined so as to be substantially perpendicular with respect to the radiation direction (the direction of arrow α3) of radio waves according to the antennas 13B. In this case, the refraction of the radio waves radiated from the antennas 13B is small, and changes in the radiation pattern can be reduced.

Furthermore, the longest distance d7 that follows the radiation direction of radio waves according to the antennas 13B between the top surface of the wireless module 10 and the bottom surface 37c of the recess 37J is, for example, an approximate multiple of λ/2. Thus, the effect of the reflection of radio waves by the recess 37J can be suppressed.

In this way, the wireless device 1J has the bottom surface 37c of the recess 37J as a tapered surface that is substantially orthogonal to the radiation direction of radio waves according to the antennas 13B. Thus, the reflection of radio waves in a direction that does not follow the radiation direction of radio waves in the recess 37J is suppressed, and deterioration of antenna characteristics can be suppressed.

Figure 17:
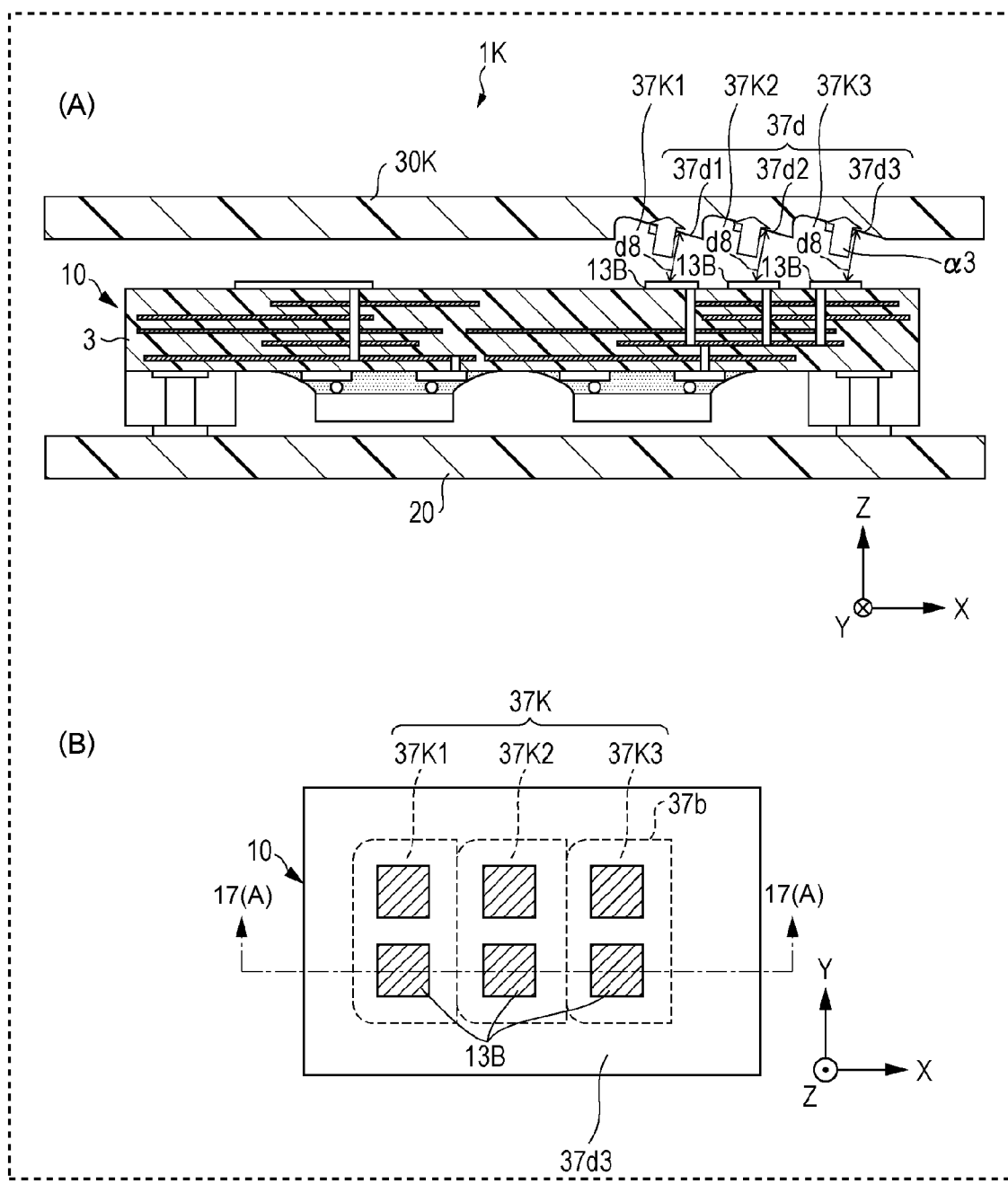
FIG. 17 is a cross-sectional view and a plan view depicting a second exemplary structure of the wireless device in the fourth embodiment.

FIG. 17(A) is a cross-sectional view depicting a wireless device 1K as a second exemplary structure of the wireless device in the fourth embodiment, and is an 17(A)-17(A) cross-sectional view of the wireless device 1K of FIG. 17(B). FIG. 17(B) is a plan view depicting an exemplary structure of the wireless device 1K, and depicts the case where the wireless module 10 is viewed from above (Z-axis positive side). Furthermore, in FIG. 17(B), the portion surrounding the antennas 13B in the wireless module 10 is depicted, and the depiction of other portions is omitted.

In the wireless device 1J, an example was given in which the bottom surface 37c of the recess 37J was inclined in a uniform manner; however, as depicted in FIG. 17(A), a bottom surface 37d of a recess 37K may be divided into several portions and inclined, and bottom surfaces 37d1 to 37d3 may be formed. In the FIGS. 17(A) and (B), for example, the antennas 13B are arranged in the X direction, recesses 37K1 to 37K3 are divided corresponding to each antenna element, and each divided bottom surface 37d1 to 37d3 is inclined.

Furthermore, the longest distance d8 that follows the radiation direction of radio waves according to the antennas 13B between the top surface of the wireless module 10 and the bottom surfaces 37d of the recesses 37K is, for example, an approximate multiple of λ/2. Thus, the effect of the reflection of radio waves by the recesses 37K can be suppressed.

Thus, compared to the case where the bottom surface 37c of the recess 37J is inclined in a uniform manner, it is possible for radio waves radiated from each antenna element in the antennas 13B to be incident in a substantially perpendicular manner to each bottom surface 37d1 to 37d3. Furthermore, because there are inclines corresponding to each antenna element, a set casing 30K can be made thicker compared to when the bottom surface 37c is inclined in a uniform manner, and the strength of the set casing 30K can be improved.

In this way, the wireless device 1K has the bottom surface 37d of the recess 37K that is substantially orthogonal to the radiation direction of radio waves according to the antennas 13B, corresponding to each antenna element. Thus, the reflection of radio waves in a direction that does not follow the radiation direction of radio waves in the recess 37K is suppressed, and deterioration of antenna characteristics can be suppressed. Furthermore, the set casing 30K can be strengthened.

Figure 18:
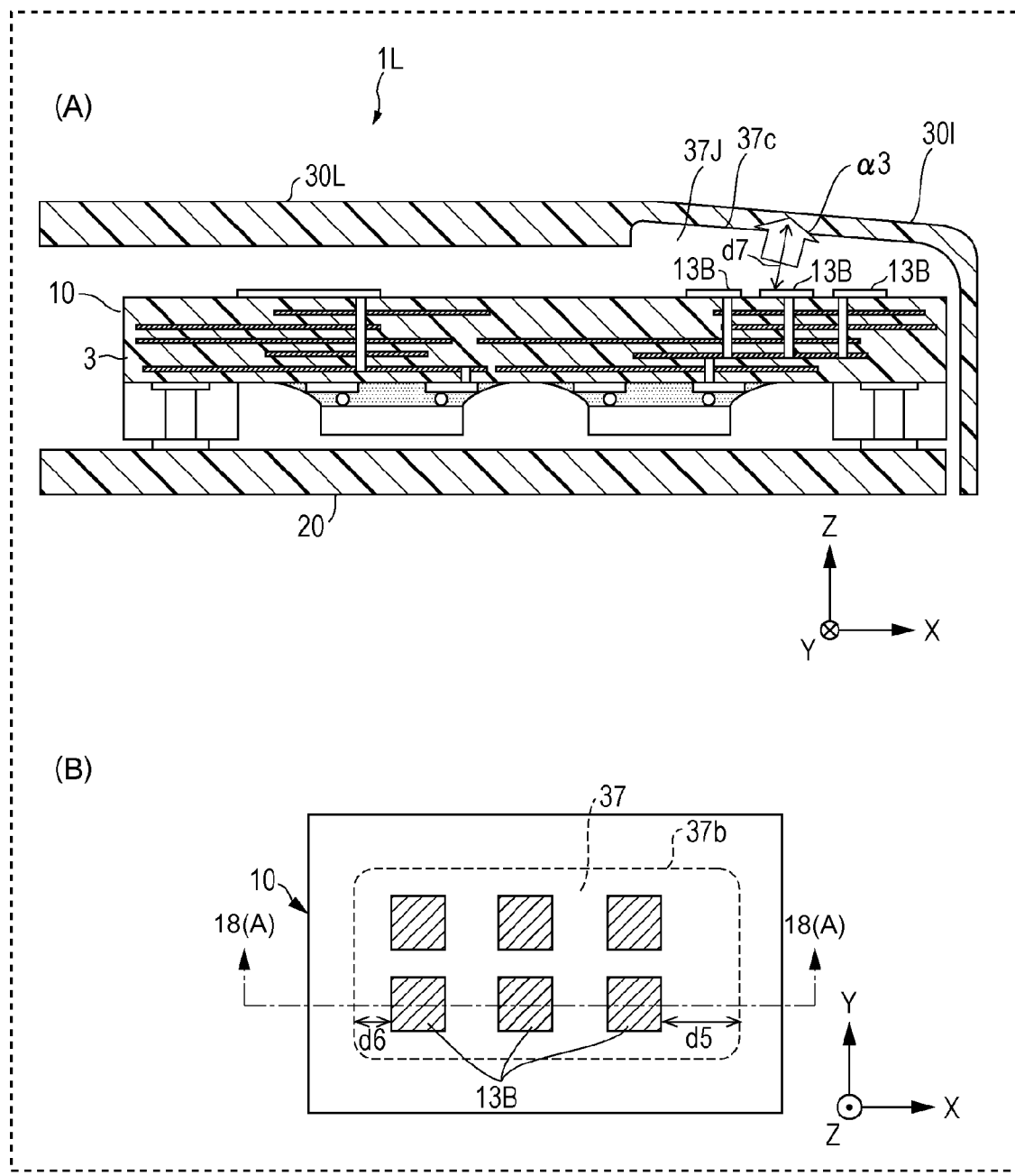
FIG. 18 is a cross-sectional view and a plan view depicting a third exemplary structure of the wireless device in the fourth embodiment.

FIG. 18(A) is a cross-sectional view depicting a wireless device 1L as a third exemplary structure of the wireless device in the fourth embodiment, and is an 18(A)-18(A) cross-sectional view of the wireless device 1L of FIG. 18(B). FIG. 18(B) is a plan view depicting an exemplary structure of the wireless device 1L, and depicts the case where the wireless module 10 is viewed from above (Z-axis positive side). Furthermore, in FIG. 18(B), the portion surrounding the antennas 13B in the wireless module 10 is depicted, and the depiction of other portions is omitted.

In the FIGS. 18(A) and (B), a description is given mainly with regard to the differences with the wireless device 1J depicted in FIGS. 16(A) and (B), and a description regarding the configuration that is the same as the wireless device 1J is omitted.

In the wireless devices 1J and 1K, examples were given in which the bottom surfaces 37c and 37d of the recesses 37J and 37K were inclined. In the wireless device 1L, as depicted in FIG. 18(A), an outer peripheral surface 30l on the opposite side to the bottom surface 37c of the recess 37J of a set casing 30L is also inclined. For example, the outer peripheral surface 30l of the set casing 30L and the bottom surface 37c of the recess 37J are formed substantially parallel.

According to the wireless device 1L, the radiation direction of radio waves is substantially orthogonal with respect to the outer peripheral surface and the inner peripheral surface of the set casing 30L, and therefore the refraction of radio waves when radio waves pass from the inside of the set casing 30L to the outside can be reduced. Furthermore, the set casing 30L can be made thin, and therefore the electrical length when radio waves pass through the set casing 30L becomes shorter, and changes in the radiation direction of radio waves according to the set casing 30L can be suppressed.

It should be noted that the present disclosure is not limited to the configurations of the aforementioned embodiments, and any kind of configuration can be applied as long as the configuration is such that the functions indicated by the scope of the patent claims or the functions of the configurations of the present embodiments are able to be achieved.

For example, in the aforementioned embodiments, patch antennas were mainly assumed as the antennas; however, other antennas may be used.

Furthermore, the wireless devices 1J and 1K are configured in such a way that the distances between the antennas and a side surface of the recess differ depending on whether it is the radio-wave radiation side or the opposite side to the radio-wave radiation side (for example, distances d5 and d6); however, these distances may be the same.

Furthermore, the embodiments and the exemplary structures have been described using a common wireless module 10; however, another known wireless module 10 may be used.

It should be noted that the embodiments or the exemplary structures of the wireless devices may be combined as appropriate.

(Summary of an Embodiment of the Present Disclosure)

A first wireless device of the present disclosure comprises:
  a substrate;
  a wireless module that is mounted on the substrate and has an antenna unit; and
  a casing that accommodates the substrate and the wireless module,
  wherein the wireless device has a gap from the antenna unit toward the casing, and the gap has a length that is an approximate multiple of a half-wavelength of a radio wave corresponding to a communication frequency of the antenna unit.

A second wireless device of the present disclosure is the first wireless device,
  wherein the casing includes an antenna-opposing region that opposes the antenna unit, and a non-antenna-opposing region that is a region other than the antenna-opposing region,
  and the antenna-opposing region is formed from a material that has a lower relative permittivity, or a smaller dielectric loss tangent, than the non-antenna-opposing region.

A third wireless device of the present disclosure is the first or second wireless device,
  wherein the third wireless device has a gap between the antenna unit and the casing, and the gap has a length that is an approximate multiple of a half-wavelength of a radio wave corresponding to the communication frequency of the antenna unit.

A fourth wireless device of the present disclosure is the first or second wireless device,
  wherein the fourth wireless device further comprises a first member between the antenna unit and the casing,
  and has a gap between the antenna unit and the first member, and the gap has a length that is an approximate multiple of a half-wavelength of a radio wave corresponding to the communication frequency of the antenna unit.

A fifth wireless device of the present disclosure is the first or second wireless device,
  wherein the fifth wireless device further comprises a first member between the antenna unit and the casing,
  and, when a distance between the antenna unit and the first member is less than a half-wavelength of a radio wave corresponding to the communication frequency of the antenna unit, the first member has an opening in a region, which opposes the antenna unit.

A sixth wireless device of the present disclosure is the first wireless device,
  wherein the casing has a recessed section in a region that opposes the antenna unit,
  and a distance between the antenna unit and the recessed section is a length that is an approximate multiple of a half-wavelength of a radio wave corresponding to the communication frequency of the antenna unit.

A seventh wireless device of the present disclosure is the sixth wireless device,
  wherein a distance between the antenna unit and a bottom surface of the recessed section is a length that is an approximate multiple of a half-wavelength of a radio wave corresponding to the communication frequency of the antenna unit.

An eighth wireless device of the present disclosure is the sixth or seventh wireless device,
  wherein a distance between the antenna unit and a side surface of the recessed section is a length that is an approximate multiple of a half-wavelength of a radio wave corresponding to the communication frequency of the antenna unit.

A ninth wireless device of the present disclosure is any one of the sixth to eighth wireless devices, wherein a distance between the antenna unit and a first side surface of the recessed section that corresponds to a radiation direction of the radio wave is longer than a distance between the antenna unit and a second side surface of the recessed section that corresponds to a direction opposite to the radiation direction of the radio wave.

A tenth wireless device of the present disclosure is any one of the sixth to ninth wireless devices, wherein an area of the first side surface of the recessed section that corresponds to the radiation direction of the radio wave is larger than an area of the second side surface of the recessed section that corresponds to the direction opposite to the radiation direction of the radio wave.

An eleventh wireless device of the present disclosure is any one of the sixth to tenth wireless devices, wherein the bottom surface of the recessed section of the casing has a tapered surface that is substantially orthogonal to the radiation direction of the radio wave.

A twelfth wireless device of the present disclosure is the eleventh wireless device, wherein the antenna unit includes a plurality of antenna elements, and the bottom surface of the recessed section of the casing has a tapered surface that is substantially orthogonal to a radiation direction of the radio wave from each of the antenna elements.

A thirteenth wireless device of the present disclosure is the eleventh or twelfth wireless device, wherein an outer peripheral surface of the casing has a tapered surface that follows the bottom surface of the recessed section.

INDUSTRIAL APPLICABILITY

An aspect of the present disclosure is useful in a wireless device or the like that suppresses deterioration of antenna characteristics and can be made thin.

REFERENCE SIGNS LIST 1, 1A, 1B, 1C, 1D, 1E, 1F, 1G, 1H, 1I, 1J, 1K, 1L wireless device
10 wireless module
20 set substrate
30, 30A, 30B1, 30B2, 30E, 30H, 30I, 30J, 30K, 30L set casing
3 module substrate
3a metal layer
3b dielectric layer
3c GND layer
3d wiring layer
8, 9 LSI
11 GND pattern
13, 13A, 13B antenna
17, 36 signal via
19, 33 GND via
21a, 21b, 21c, 21d pad
22a, 22b, 22c, 22d solder ball
27 mold section
31 antenna-opposing region
32 other region
34 opening
35 electromagnetic shield
35a opening
37, 37H, 37I, 37J, 37K, 37K1, 37K1, 37K2, 37K3 recess
37a, 37c, 37d, 37d1, 37d2, 37d3 bottom surface
37b, 37b1, 37b2, 37b3, 37b4 side surface
40 gap

The invention claimed is:

1. A wireless device comprising:
a substrate;
a wireless module that is mounted on the substrate and includes an antenna unit; and
a casing that accommodates the substrate and the wireless module and has a recessed section in a region that opposes the antenna unit,
wherein a distance between the antenna unit and the recessed section is a length that is an approximate multiple of a half-wavelength of a radio wave corresponding to the communication frequency of the antenna unit, and
a distance between the antenna unit and a first side surface of the recessed section that corresponds to a radiation direction of the radio wave is longer than a distance between the antenna unit and a second side surface of the recessed section that corresponds to a direction opposite to the radiation direction of the radio wave.

2. The wireless device according to claim 1,
wherein the casing includes an antenna-opposing region that opposes the antenna unit, and a non-antenna-opposing region that is a region other than the antenna-opposing region,
and the antenna-opposing region is formed from a material that has a lower relative permittivity, or a smaller dielectric loss tangent, than the non-antenna-opposing region.

3. The wireless device according to claim 1, further comprising,
a first member provided between the antenna unit and the casing such that a gap is provided between the antenna unit and the first member, the gap having a length that is an approximate multiple of a half-wavelength of the radio wave.

4. The wireless device according to claim 1, further comprising,
a first member provided between the antenna unit and the casing,
wherein a distance between the antenna unit and the first member is less than a half-wavelength of the radio wave, and the first member has an opening in a region, which opposes the antenna unit.

5. The wireless device according to claim 1,
wherein a distance between the antenna unit and a bottom surface of the recessed section is a length that is an approximate multiple of a half-wavelength of the radio wave.

6. The wireless device according to claim 1,
wherein a distance between the antenna unit and a side surface of the recessed section is a length that is an approximate multiple of a half-wavelength of the radio wave.

7. The wireless device according to claim 1,
wherein a bottom surface of the recessed section of the casing has a tapered surface that is substantially orthogonal to a radiation direction of the radio wave.

8. The wireless device according to claim 7,
wherein the antenna unit includes a plurality of antenna elements,
and a bottom surface of the recessed section of the casing has a tapered surface that is substantially orthogonal to a radiation direction of a radio wave from each of the antenna elements.

9. The wireless device according to claim 7,
wherein an outer peripheral surface of the casing has a tapered surface along the bottom surface of the recessed section.

10. A wireless device comprising:
a substrate;
a wireless module that is mounted on the substrate and includes an antenna unit; and
a casing that accommodates the substrate and the wireless module and has a recessed section in a region that opposes the antenna unit,
wherein a distance between the antenna unit and the recessed section is a length that is an approximate multiple of a half-wavelength of a radio wave corresponding to the communication frequency of the antenna unit, and
an area of a first side surface of the recessed section that corresponds to the radiation direction of the radio wave is larger than an area of a second side surface of the recessed section that corresponds to a direction opposite to the radiation direction of the radio wave.

11. The wireless device according to claim 10,
wherein the casing includes an antenna-opposing region that opposes the antenna unit, and a non-antenna-opposing region that is a region other than the antenna-opposing region,
and the antenna-opposing region is formed from a material that has a lower relative permittivity, or a smaller dielectric loss tangent, than the non-antenna-opposing region.

12. The wireless device according to claim 10, further comprising,
a first member provided between the antenna unit and the casing such that a gap is provided between the antenna unit and the first member, the gap having a length that is an approximate multiple of a half-wavelength of the radio wave.

13. The wireless device according to claim 10, further comprising,
a first member provided between the antenna unit and the casing,
wherein a distance between the antenna unit and the first member is less than a half-wavelength of the radio wave, and the first member has an opening in a region, which opposes the antenna unit.

14. The wireless device according to claim 10,
wherein a distance between the antenna unit and a bottom surface of the recessed section is a length that is an approximate multiple of a half-wavelength of the radio wave.

15. The wireless device according to claim 10,
wherein a distance between the antenna unit and a side surface of the recessed section is a length that is an approximate multiple of a half-wavelength of the radio wave.

16. The wireless device according to claim 10,
wherein a bottom surface of the recessed section of the casing has a tapered surface that is substantially orthogonal to a radiation direction of the radio wave.

17. The wireless device according to claim 16,
wherein the antenna unit includes a plurality of antenna elements,
and a bottom surface of the recessed section of the casing has a tapered surface that is substantially orthogonal to a radiation direction of a radio wave from each of the antenna elements.

18. The wireless device according to claim 16,
wherein an outer peripheral surface of the casing has a tapered surface along the bottom surface of the recessed section.

* * * * *